(12) United States Patent
Brunner et al.

(10) Patent No.: US 11,733,329 B2
(45) Date of Patent: Aug. 22, 2023

(54) $B_0$ SHIMMING DEVICE FOR MRI

(71) Applicants: ETH Zurich, Zurich (CH); UNIVERSITAET ZUERICH, Zurich (CH)

(72) Inventors: David Brunner, Jona (CH); Simon Gross, Zurich (CH); Klaas Pruessmann, Zurich (CH)

(73) Assignees: UNIVERSITAET ZUERICH, Zurich (CH); ETH ZURICH, Zurich (CH)

( * ) Notice: Subject to any disclaimer, the term of this patent is extended or adjusted under 35 U.S.C. 154(b) by 0 days.

(21) Appl. No.: 17/390,985

(22) Filed: Aug. 1, 2021

(65) Prior Publication Data

US 2022/0018921 A1 Jan. 20, 2022

Related U.S. Application Data

(63) Continuation of application No. 16/083,973, filed as application No. PCT/EP2017/050862 on Jan. 17, 2017, now abandoned.

(30) Foreign Application Priority Data

Jan. 17, 2016 (EP) .................... 16151629

(51) Int. Cl.
*G01R 33/3873* (2006.01)
*G01R 33/38* (2006.01)
*G01R 33/54* (2006.01)

(52) U.S. Cl.
CPC ..... *G01R 33/3873* (2013.01); *G01R 33/3804* (2013.01); *G01R 33/543* (2013.01)

(58) Field of Classification Search
CPC ............ G01R 33/3873; G01R 33/3804; G01R 33/543
See application file for complete search history.

(56) References Cited

U.S. PATENT DOCUMENTS 4,612,505 A 9/1986 Zijlstra
6,477,398 B1 * 11/2002 Mills ...................... G01R 33/16
324/201

(Continued)

FOREIGN PATENT DOCUMENTS

JP H08215168 A 8/1996

OTHER PUBLICATIONS

Brunner et al., Magnetic Pebbles—Materials with Controllable Magnetism for Compact, Low-Power Shim Units, Proceedings of the International Society for Magnetic Resonance in Medicine, Apr. 22, 2016, p. 492, XP040681535.

(Continued)

*Primary Examiner* — Akm Zakaria
(74) *Attorney, Agent, or Firm* — Agris & von Natzmer LLP; Joyce von Natzmer

(57) ABSTRACT

A magnetic resonance (MR) apparatus comprises magnet means for generating a main magnetic field in a sample region, encoding means for generating encoding magnetic fields superimposed to the main magnetic field, RF transmitter means for generating MR radiofrequency fields, driver means for operating said encoding means and RF transmitter means to generate superimposed time dependent encoding fields and radiofrequency fields according to an MR sequence for forming images or spectra; and acquisition means for acquiring an MR signal from said object. The magnet means comprise a primary magnetic field source providing a static magnetic field $B_0$ and at least one secondary magnetic field source providing an adjustable magnetic field B'. To provide improved shimming, the secondary magnetic field source comprises at least two spatially distinct portions of a first magnetic material and of a second magnetic material, respectively, said first magnetic material having a first magnetic moment density m1 and said second (Continued)

magnetic material having a second magnetic moment density m2, and means for independently adjusting said second magnetic moment density m2 by variation of an external control parameter.

21 Claims, 5 Drawing Sheets

(56) References Cited

U.S. PATENT DOCUMENTS

| | | | | |
|---|---|---|---|---|
| 7,961,067 B2* | 6/2011 | Chiba | ............... | G01R 33/3806 |
| | | | | 324/318 |
| 7,962,019 B2* | 6/2011 | Seeber | ............... | G01R 33/389 |
| | | | | 392/407 |
| 8,581,585 B2* | 11/2013 | Arai | ............... | G01R 33/583 |
| | | | | 324/309 |
| 2006/0113995 A1* | 6/2006 | Jarvis | ............... | G01R 33/3873 |
| | | | | 324/318 |
| 2010/0045293 A1 | 2/2010 | Ando et al. | | |
| 2010/0207630 A1 | 8/2010 | Barnes et al. | | |

OTHER PUBLICATIONS

International Search Report (ISR) issued in PCT/EP2017/050862 (dated Jun. 8, 2017).
Koch et al., Sample-specific diamagnetic and paramagnetic passive shimming, Journal of Magnetic Resonance, Sep. 1, 2006, vol. 182,Nr:1,pp. 66-74.

* cited by examiner

$B_0$ SHIMMING DEVICE FOR MRI

CROSS REFERENCE TO RELATED APPLICATIONS

This is a continuation of U.S. patent application Ser. No. 16/083,973, which is the US national stage entry of international patent application no. PCT/EP2017/050862, filed Jan. 17, 2017 claiming priority to European patent application no. EP16151629.9, filed Jan. 17, 2016, wherein the above mentioned applications are incorporated herein by reference in their entireties.

FIELD OF THE INVENTION

The present invention generally relates to a magnetic resonance (MR) apparatus and a method of operating the same. More particularly, the invention relates to the task of applying shimming corrections to the main magnetic field in a MR system, particularly an MR imaging (MRI) system.

BACKGROUND OF THE INVENTION

Susceptibility induced off-resonances challenge many cutting-edge magnetic resonance applications using single shot read-outs, balanced acquisitions or high-resolution spectroscopy, in particular at ultra-high fields.

Typically MRI and NMR magnets are constructed to deliver net uniformities in the region of the volume of interest of the order of 1 ppm. The primary magnet itself, which is either wound by resistive or superconductive wires or constructed from a permanent magnetic material, does usually not deliver the required uniformity. Therefore correction units are installed. Most frequently ferromagnetic plates (shims) are distributed along the bore such that the magnetic field becomes uniform [1, 2]. This so called "shimming" procedure is typically performed at production and/or installation of the magnet.

However, once the subject is exposed to the magnetic field of the main magnet, the susceptible material of the subject itself distorts the magnetic field in the subject. These distortions are usually measured at the beginning of a sequence and compensated by actuating a set of electromagnets typically contracted from resistive coils. These shim coils are typically designed to produce fields of spherically or cylindrically harmonic fields.

The shim coils are either integrated in the gradient coils, or dedicated insert shim coils lining the gradient coil are used.

$B_0$ shimming with increased number of channels yields critical improvement of the achieved field uniformity. However, providing high numbers of shim coils represents a trade-off with other specifications of the MRI scanner. Integration of shim coils in the gradient tube can reduce the free bore space by thickening the gradient tube. Furthermore, additional heat is created in the gradient tube for which either the cooling has to be improved or the limits of the gradients have to be reduced. Furthermore, the conductors of the shim coils can carry eddy currents induced by the fast gradient switching and thereby distort and delay the gradient field. Furthermore, there can be substantive coupling to the gradient channels with the same adverse effect.

Using insert shim coils represents a similar trade-off; however the free bore diameter can be obtained back when unmounting the coil, but this additional handling effort is often a problem in practice due to the high weight and the cabling.

The weight and cabling size can be reduced by reducing the power requirements of the shim unit. Coil conductors in close proximity to the subject [3] or even on the RF coils [4] are significantly more efficient. Thereby the size of the coil conductor windings and the power requirements are drastically reduced. However, unwanted interactions with the RF operation of the scanner are hard to tame and also coupling to the switching gradients is an obvious problem. Also, the handling is further aggravated by the amount of conductors in the unit and the large number of high-current wires routed through the bore. Still further, highly stabilized current supplies need to be fitted into the technical room.

US 2006/113995 A1 discloses a magnetic field generating apparatus and a method for magnetic resonance imaging which comprises two spatially distinct sets of shim elements and means for independently regulating the temperature of at least a portion of one set of shim elements in order to compensate for B0 field variations caused by a temperature drift in the apparatus. Similar arrangements are also described in JP H08 215168 A, US 2010/045293 A1 and US 2010/207630 A1, which all aim either at compensating the effect of an overall temperature drift or at reducing magnetic field inhomogeneity present after initial set-up of an MRI arrangement.

SUMMARY OF THE INVENTION

In view of the above there is a need for an improved local $B_0$ shimming that overcomes or at least reduces the above mentioned disadvantages of electromagnetic shim elements and which allows for reduction of magnetic field distortions caused by the introduction of a subject or object into the MR apparatus.

Therefore, according to one aspect of the invention, there is provided a magnetic resonance (MR) apparatus comprising:
  a) magnet means for generating a main magnetic field in a sample region;
  b) encoding means for generating encoding magnetic fields superimposed to the main magnetic field,
  c) RF transmitter means for generating MR radiofrequency fields;
  d) driver means for operating said encoding means and RF transmitter means to generate superimposed time dependent encoding fields and radiofrequency fields according to an MR sequence for forming images or spectra; and
  e) acquisition means for acquiring an MR signal from said object;
    wherein said magnet means comprise a primary magnetic field source providing a static magnetic field $B_0$ and at least one secondary magnetic field source providing an adjustable magnetic field B';
  wherein said secondary magnetic field source comprises at least two spatially distinct portions of a first magnetic material and of a second magnetic material, respectively, said first magnetic material having a first magnetic moment density m1 and said second magnetic material having a second magnetic moment density m2, and means for independently adjusting said second magnetic moment density m2 by variation of an external control parameter, the apparatus further comprising means for determining an instant spatial distribution of the static magnetic field resulting from said static magnetic field B0 and said adjustable magnetic field B'.

In the present context, denoting different magnetic materials as "first magnetic material" and "second magnetic material" will follow the convention that the material used for adjusting the magnetic field B' will be denoted as "second magnetic material". This does not rule out that the other (i.e. the "first") magnetic material could also have an adjustable magnetic moment density, but this is not mandatory in the context of the present invention. It would also be possible to use an arrangement wherein the first magnetic material has a vanishingly small magnetic moment density m1.

The secondary magnetic field sources according to the present invention correspond to what is often called "shim units" in the field of MR technology.

Another aspect of the invention relates to a method of operating an MR apparatus as defined above, wherein said external control parameter is adjusted in such manner as to obtain a predetermined main magnetic field B resulting from the superposition of the static magnetic field $B_0$ and the adjustable magnetic field B' of each secondary magnetic field source, the adjustment being carried out at the beginning of an MR sequence for forming images or spectra, after a sample or subject has been introduced into the sample region.

Advantageous embodiments are defined in the dependent claims and described further below.

According to a particularly advantageous embodiment, the second magnetic moment density m2 is adjustable in a range extending from values that are smaller than the first magnetic moment density m1 to values that are larger than the first magnetic moment density m1.

In principle, any external influence factor that allows for efficient and reliable adjustment of the magnetic moment density could be used as external control parameter in the sense of the present invention. Advantageously, the external control parameter is selected from the group consisting of temperature, pressure, shear and light illumination prevailing at the secondary magnetic field source and electric current flowing therethrough.

According to a particularly advantageous embodiment (claim 4), the external control parameter is the local temperature of the portion of second magnetic material and the adjusting means are configured to adjust said local temperature in a control temperature range extending from a lowest control temperature $T_L$ to a highest control temperature $T_H$, the second magnetic material having a Curie temperature $T_c$ lying within said control temperature range. As generally known, when ferromagnetic materials are heated above their Curie temperature they experience a marked loss in their magnetic moment density and undergo a transition from ferromagnetic to paramagnetic behavior. This is most advantageous in combination with the embodiment of claim 2, because it allows providing a direction-switchable secondary magnetic field source without having to use diamagnetic materials. Diamagnetic materials generally have a magnetic susceptibility that is only weakly dependent on temperature and thus are not well suited for building up an adjustable magnetic field source.

As generally known, the Curie temperature is a material-dependent property that varies over a wide range. It is also known that e.g. in certain alloys it is possible to adjust the Curie temperature over a considerable range by variation of the composition. For many instances where the present invention may be useful, it will be advantageous to use compounds with a Curie temperature that is somewhat higher than ambient temperature, meaning that one could switch between ferromagnetic and paramagnetic behavior by raising the temperature by a certain amount above ambient temperature. Therefore, according to one embodiment the Curie temperature $T_c$ of the second magnetic material is in the range from 300K to 450K. For example, one can use a nickel-copper alloy with a composition Ni75Cu25, which has a Curie temperature of about 80° C.

According to a further embodiment, the secondary magnetic field source is formed as an elongated body having a longitudinal axis wherein a plurality of spatially distinct portions are arranged at distinct positions along said longitudinal axis. For example, each spatially distinct portion can be electrically heated by driving a current through a resistor. Its temperature is locally measured via a thermocouple. Each of these units is thermally isolated and RF shielded. Alternatively, optical fibers can be employed to deliver heat to the magnetic material and reading out the temperature (i.e. fluoro-optically). This offers the advantage of very good decoupling of the shim units from the RF and the gradient switching in the scanner, albeit at a higher complexity. Still alternatively, Peltier or an equivalent type of elements allowing heating and cooling can be employed.

For many applications, e.g. for whole body MRI scanners, it will be advantageous to have an embodiment comprising a plurality of secondary magnetic field sources arranged circumferentially around the sample region. Such an arrangement provides for good compensation of any unwanted distortions of the main magnetic field in the region of interest.

According to a further embodiment, each secondary magnetic field source comprises means for determining an instant value of the external control parameter. This allows for continuous and rapid monitoring and adjustment of the operation of the secondary magnetic field sources. When using local temperature as the external control parameter, the determining means can be selected from known temperature sensor types such as e.g. thermistors or thermocouples. The temperature is advantageously controlled via a close loop controlling system. The controller can be positioned in the bore of the MR system, e.g. an MRI system. The controller consists of a small multi-channel PWM current low-side driver, multichannel thermocouple read-out units and a microcontroller. The microcontroller has a data link out of the bore. The microcontroller reads the data obtained from the thermocouple and adjusts the PWM ratio of the current source. A PID controller can be used for this purpose.

According to the present invention it is contemplated that the materials to be used as first and/or second magnetic materials could be selected from a large variety of magnetic materials. According to an advantageous embodiment, the second magnetic material is formed of an alloy containing Fe, Ni, Ga, Mn, Gd, Sm, Nd, Dy, Eu or Co.

In an advantageous embodiment, the adjustable magnetic field B' of each secondary magnetic field source in an axial direction z of the static magnetic field $B_0$ can be switched between positive and negative values as a function of the external control parameter. This is particularly useful for achieving an appropriate shimming action over a wide adjustment range.

As evident from the above, we hereby disclose a novel approach to local $B_0$ shimming using materials whose magnetic moment arising from the material's magnetic susceptibility can be controlled in the bore of the MRI scanner. In this manner the advantages of the passive shimming approach (low power, very high order) can be combined with the advantages of the active shim coils of being adaptive to the sample's susceptibility distribution.

The magnetic moment of the material is hereby controlled by controlling the temperature, the pressure/shear [5], light illumination [6] and/or the electric current and or field through a portion of magnetic material.

In a particular embodiment, the magnetization of a portion of the magnetic material is controlled by a heater. The heat is applied by an electric current through a resistor or resistor wire that is regulated using a temperature sensor measuring the temperature of said portion of magnetic material. Thereby the temperature and concomitantly the magnetic moment of the material can be controlled in a closed loop. The electric current can be provided by a DC, AC or a modulated source.

The temperature dependence of the material is thereby a design parameter in the system. A high Curie point gives a large range for control while a Curie point close to room temperature is in particular energy efficient. The Curie point of materials can be controlled via the stoichiometry of the alloy, e.g. [7].

The adaptive shimming will be achieved by the field produced by the magnetic material. However, typically net shimming fields with both signs are required, but materials with susceptibilities that can be altered with both signs are typically not available. However, the controllable materials can be arranged such that the magnetic field produced by the arrangement outside the magnetic material can have both signs dependent on the magnetism of one portion of the material. Thereby both polarities of shim fields can be generated. A particular example is a substantially cylindrical, arrangement with its axis along the external magnetic field that is longer than the volume of interest. If the magnetic moment density of the arrangement is constant, the field induced by the arrangement outside the cylinder is substantially zero. Locally increasing the magnetic moment density of portion of the arrangement produces an additional net field outside the cylinder of said increase in magnetic moment, conversely a reduction produces a field with opposite sign.

The energy efficiency of the approach is furthermore determined by the provided thermal isolation of the controlled magnetic material portion. Materials with very low thermal conductivity such as foams, glass, vacuum capsules or aerogels can be employed. Furthermore materials with high thermal conductivity but preferentially low electrical conductivity can be employed for thermal grounding of the structure i.e. avoiding spreading of the heat and reducing heat transfer through the thermal isolation by flattening hot spots. Such materials are typically very hard crystals or ceramics such as aluminum oxide, aluminum nitrate.

The power efficiency is, given a high thermal isolation, much lower than with resistive shim coils. Furthermore, coupling to the switching gradient fields and field distortions induced by eddy currents running on the shim units are intrinsically very low due to the small size of the shimming units.

The speed at which the shimming fields can be ramped depends on the steepness of temperature dependence of the magnetism, the thermal capacity of the shim unit and the heating or cooling power that can be supplied. The thermal capacity can be kept low by choosing materials with high magnetization mass density. For speeding up the heat conduction in the unit a magnetic material with high heat conduction can be chosen. Furthermore, the magnetic material can be structured (by thin layering or cladding) with a material with high heat conduction in order to accelerate the heat transport in the magnetic material. The thermal capacity is optimized by choosing a material. Therefore micromachining, plating or sputtering of magnetic materials on highly heat conductive materials, or vice-versa can be beneficial.

Furthermore heat pumps such as Peltier elements can be employed in order to heat and cool the material. This would not only speed up the slewing of the magnetic shimming fields but would also allow using materials with Curie temperatures close to room temperature improving the energy efficiency maintaining high slew rates.

BRIEF DESCRIPTION OF THE DRAWINGS

The above mentioned and other features and objects of this invention and the manner of achieving them will become more apparent and this invention itself will be better understood by reference to the following description of embodiments of this invention taken in conjunction with the accompanying drawings, wherein are shown:

FIG. 1A: device comprising a rod-like object having a central section formed of a second material with a magnetic moment density m2(T) that is temperature dependent.

FIG. 1B: here the temperature of the central section has been set to establish a local magnetic moment density that is higher than that of the surrounding parts of the rod, i.e. m2(T)>m.

FIG. 1C: here the temperature of the central section has been set to establish a local magnetic moment density that is lower than that of the surrounding parts of the rod, i.e. m2(T)<m.

Figure 1A:
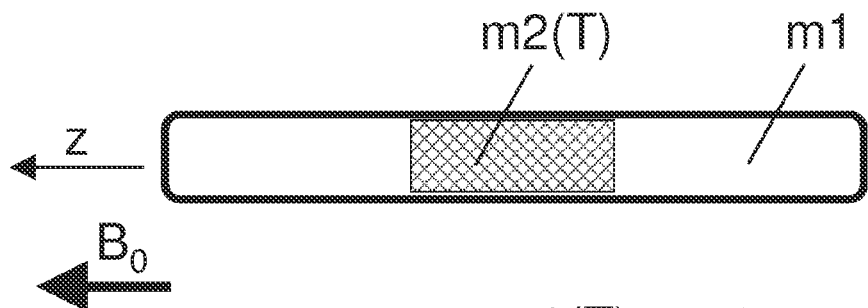
FIGS. 1A to 1D: A schematic representation of one embodiment of a secondary magnetic field source providing an adjustable magnetic field.
Figure 1B:
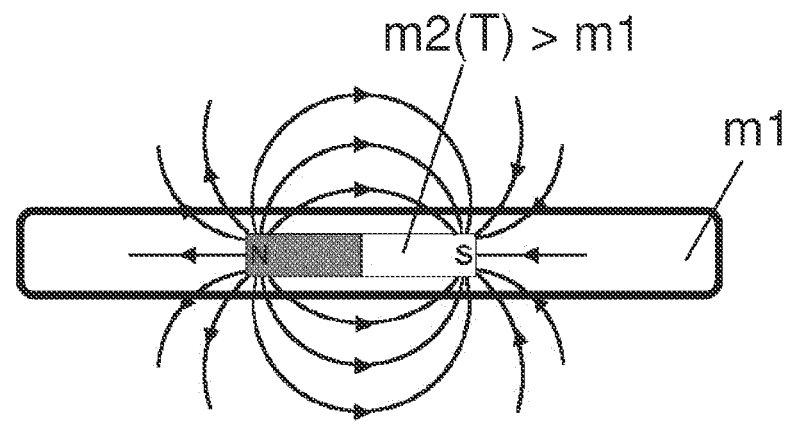
Figure 1C:
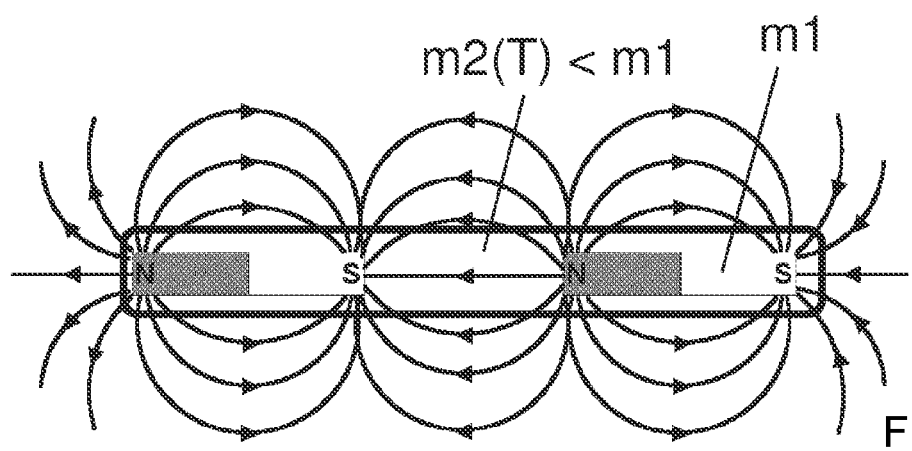

1D: situation when In the case of a long rod-like object the two terminal magnetic dipoles shown in FIG. 1C would be longitudinally stretched and thus the resulting field surrounding the object would be substantially zero.

Figure 2:
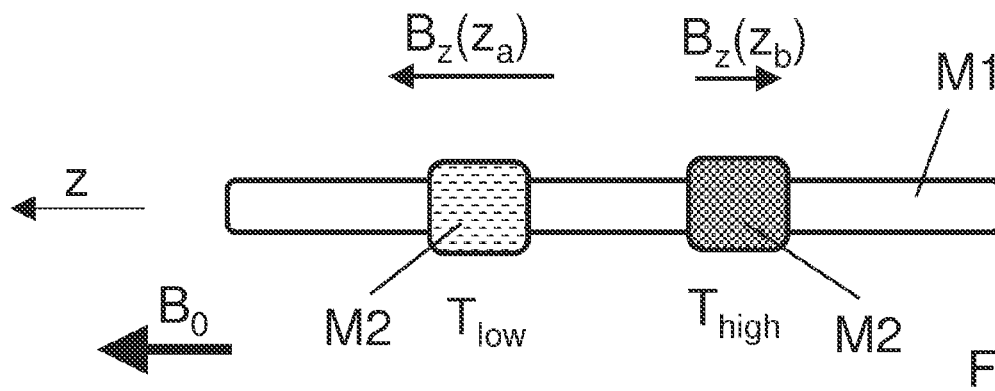

FIG. 2 A schematic representation of a further embodiment of a secondary magnetic field source providing an adjustable magnetic field.

Figure 3:
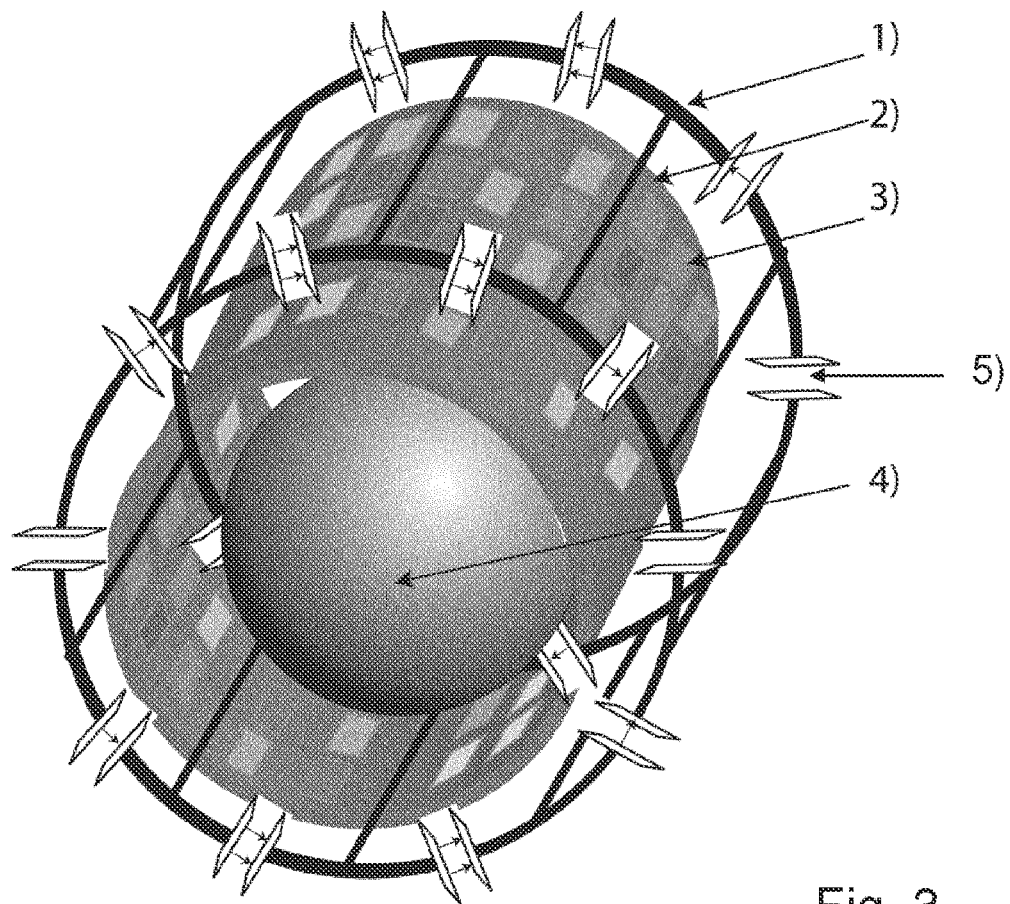

FIG. 3 An exemplary arrangement of an MRI apparatus including a plurality of adjustable magnetic field elements.

Figure 4A:
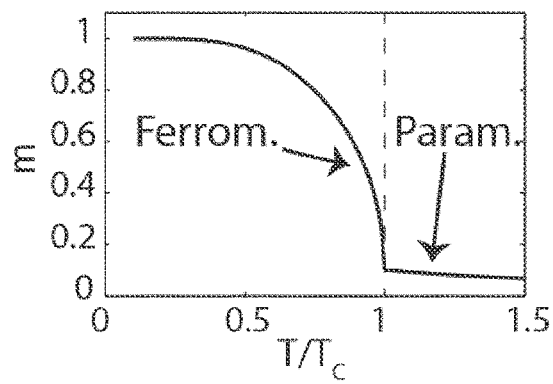
Figure 4B:
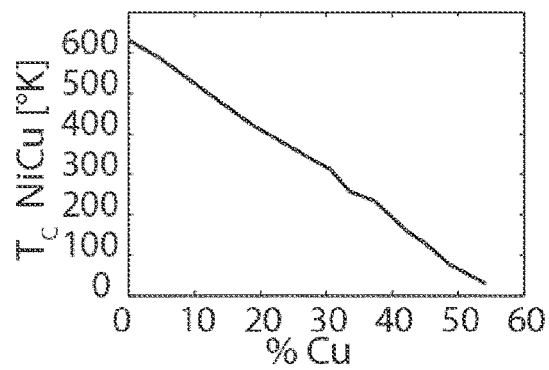

FIGS. 4A and 4B: FIG. 4A: Typical temperature dependence of the magnetic moment density (m) of a ferromagnetic particle in a strong external field. Towards the Curie temperature ($T_C$) the strong ferromagnetic moment diminishes. Above $T_C$ the paramagnetism scales still down with temperature.

FIG. 4B: $T_C$ of cupric alloys can be adjusted by the admixture of copper. Thereby the temperature range in which a magnetic particle has to be controlled can be adjusted.

Figure 5:
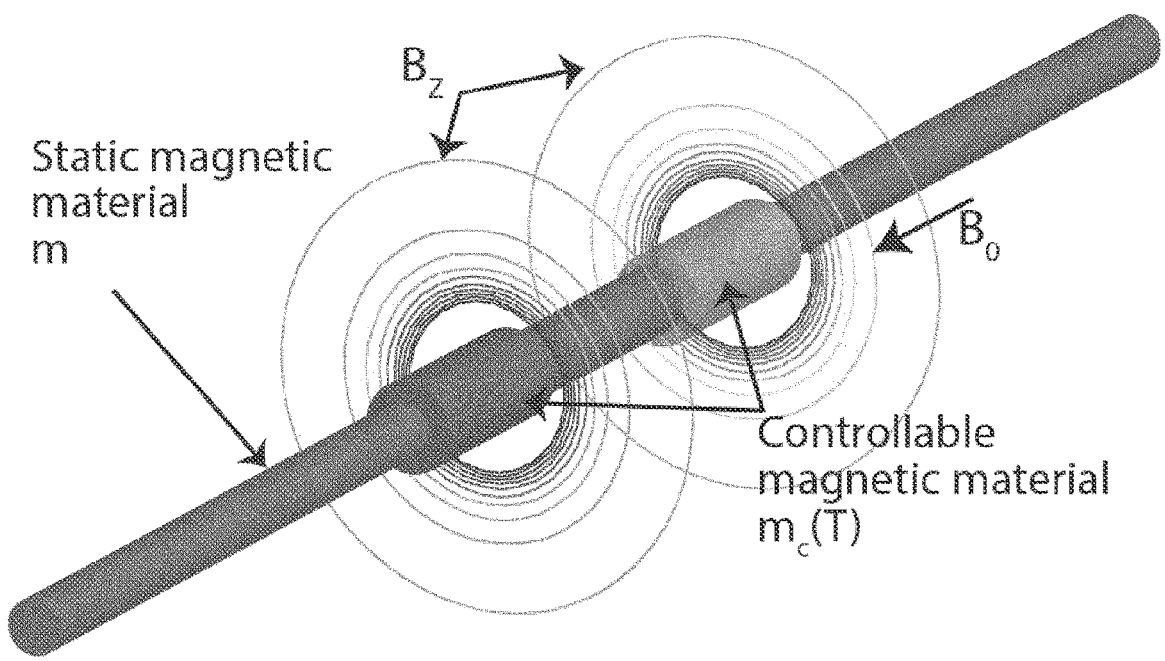

FIG. 5 Spatial distribution of magnetic material. The distribution of the static material (m) and the controllable units ($m_c(T)$) settled at half of their maximum moment provides zero magnetic field outside the cylindrical structure given it is much longer than the volume of interest. Lowering one unit's temperature provides then a net field of a paramagnet and increasing the temperature that of a net strong diamagnet. The shim units can thereby adjust the fields with both signs (bipolarly).

Figure 6A:
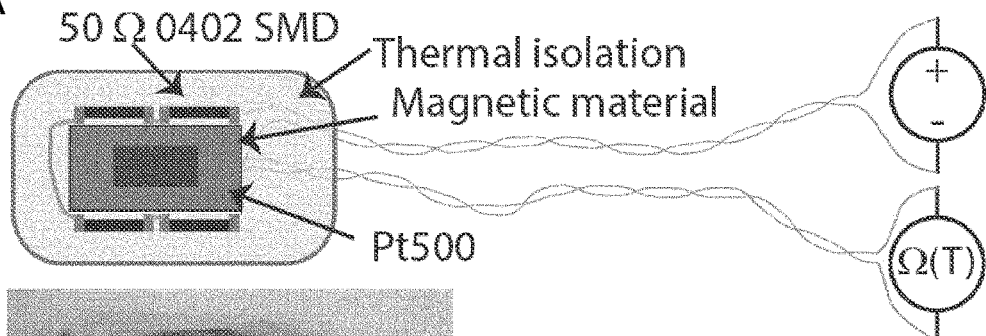
Figure 6B:
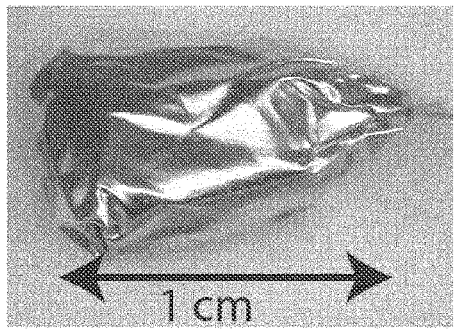
Figure 6C:
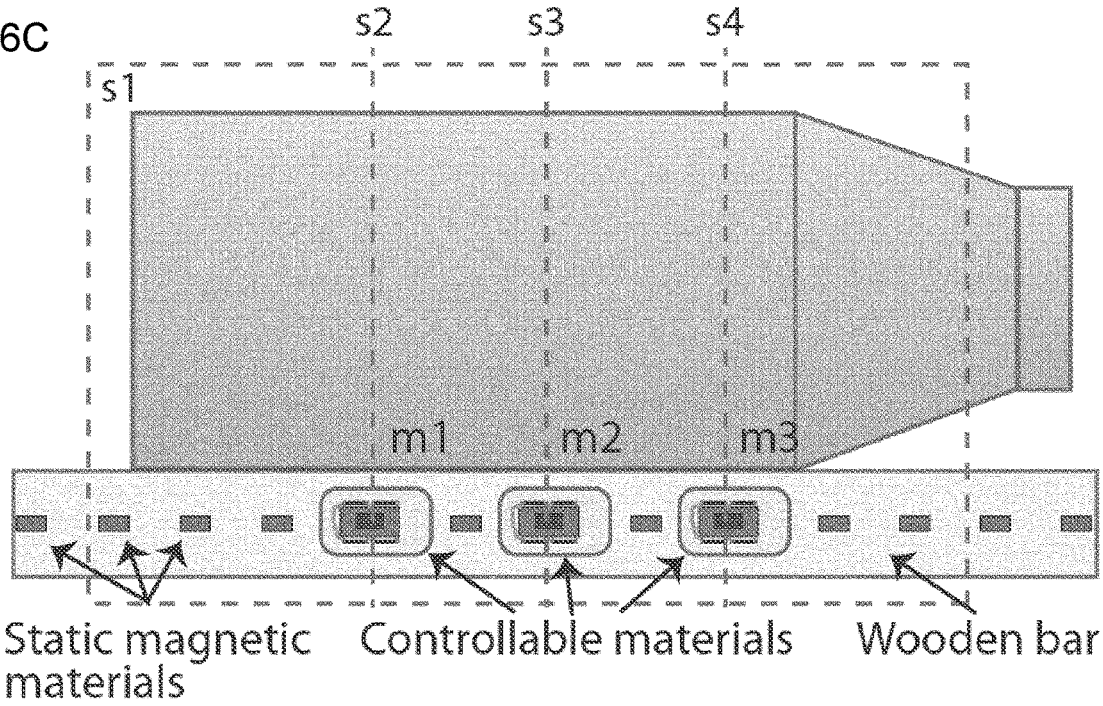

FIGS. 6A to 6C: Setup. FIG. 6A shows an embodiment in which controllable units were made of a (3 mm)$^3$ Ni75Cu25 shot thermally coupled to SMD resistors. A Pt500 measures its temperature. 50 µm diameter wires are used for connecting. A wrapper of foam is applied for isolation and aluminum foil for RF shielding. FIG. 6B: Photograph of a unit.

FIG. 6C: setup for the measurements with 3 controllable units. The static material distribution has been discretized into shots of half the volume than the units because no wire material was available.

Figure 7A:
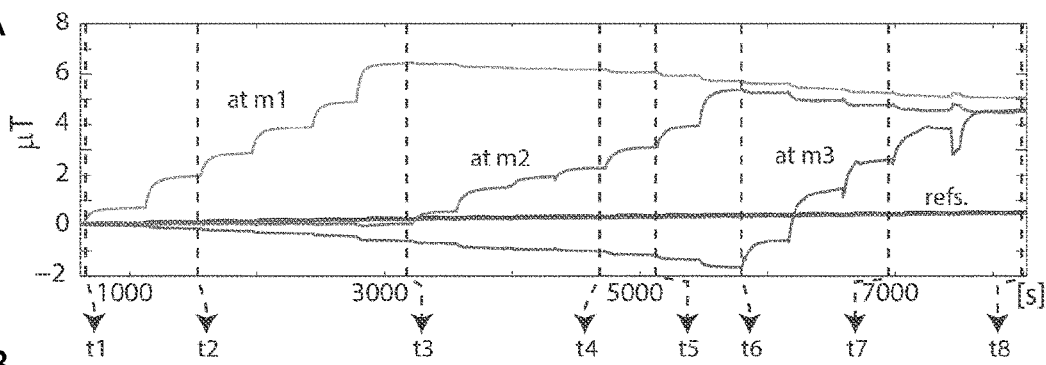
Figure 7B:
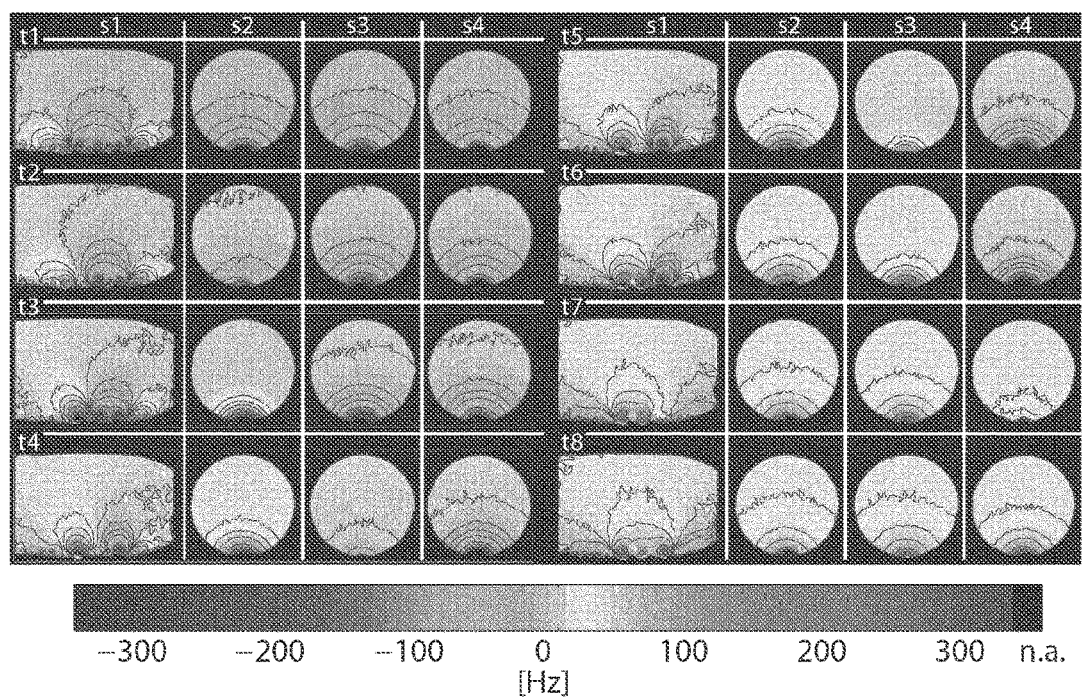
Figure 7C:
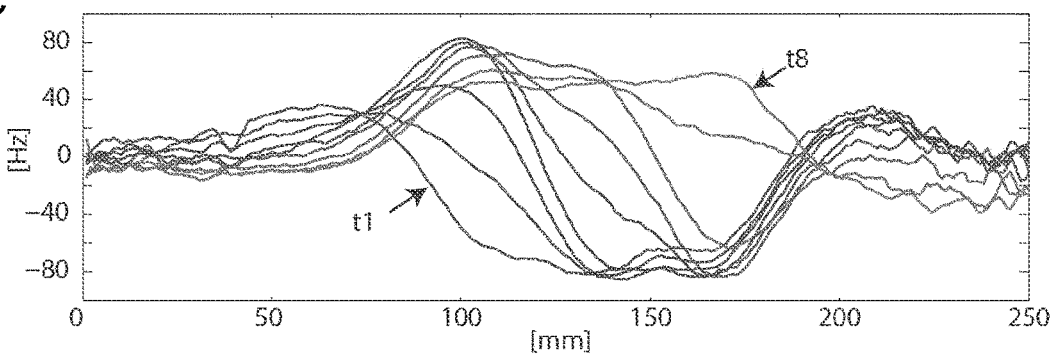

FIGS. 7A to 7C: FIG. 7A: Field as recorded by the field probes heating m1-m3 sequentially.

FIG. 7B: $B_0$ field maps in s1-s4 acquired as marked in a). Isolines at $0\pm15\pm30\pm50\pm100\pm200$ Hz. The fields show a distinct dipolar pattern in the range of $\pm300$ Hz. Close range ripples (solid arrow) result from the discretization of the magnetization distribution into shots. Casting the material into cylinders should remove this problem.

FIG. 7C shows off-resonance line profiles 4 cm distant from the shim units.

DETAILED DESCRIPTION OF THE INVENTION

In the following we will use temperature T as a representative example of an external control parameter that influences the magnetic moment density of a material of interest. As explained earlier, there are other quantities that could be used as control parameter instead of temperature, so the following examples shall not be construed as a limitation to the use of temperature as the control parameter.

The basic principle of an adjustable secondary magnetic field source is illustrated in FIGS. 1A-D. The device shown in FIG. 1A comprises a rod-like object formed predominantly of a first material with a substantially uniform magnetic moment density $m1=m$ and having a central section formed of a second material with a magnetic moment density $m2(T)$ that is temperature dependent. The device is placed in an external magnetic field $B_0$ oriented in z-direction.

FIG. 1B shows the situation where the temperature of the central section has been set to establish a local magnetic moment density that is higher than that of the surrounding parts of the rod, i.e. $m2(T)>m$. This situation corresponds to an arrangement wherein one magnetic dipole is located in the central part of the rod-like object. In contrast, FIG. 1C shows the situation where the temperature of the central section has been set to establish a local magnetic moment density that is lower than that of the surrounding parts of the rod, i.e. $m2(T)<m$. This situation corresponds to having a pair of magnetic dipoles located at the two ends of the rod-like object with a gap in the central part having a magnetic field distribution corresponding to an arrangement with one centrally arranged magnetic dipole now pointing in the opposite direction as compared to FIG. 1B. It should be noted that in the case of a long rod-like object the two terminal magnetic dipoles shown in FIG. 1C would be longitudinally stretched and thus the resulting field surrounding the object would be substantially zero. This would effectively lead to a situation as shown in FIG. 1D.

If the second material exhibits ferromagnetic behavior, the high magnetic moment situation shown in FIG. 1B can be established by keeping the local temperature T below the Curie temperature $T_c$ whereas the low magnetic moment situation shown in FIG. 1C can be established by keeping the local temperature T above the Curie temperature $T_c$.

Figure 1D:
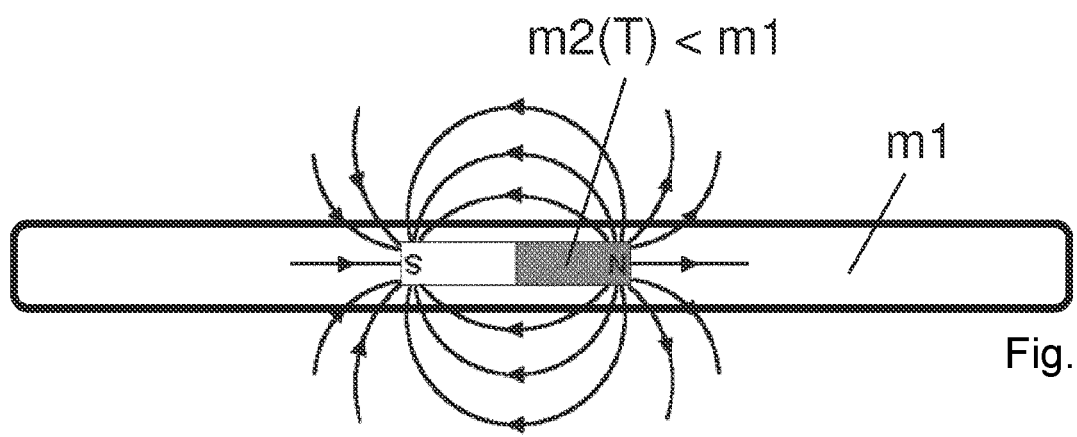

From a comparison of FIG. 1B on the one hand and FIGS. 1C and 1D on the other hand, it is seen that the secondary magnetic field in the region surrounding the central section has opposite directions in the two cases.

A more complex situation is shown schematically in FIG. 2. Here a rod-like device comprises an elongated element formed of a first magnetic material having a first material M1 with a substantially uniform magnetic moment density $m1=m$ and two portions of a second magnetic material M2 arranged axially displaced from each other at axial positions $z_a$ and $z_b$, respectively. In the situation shown in FIG. 2, the portions shown at the left and right, respectively, are set to different temperatures $T_{low}$ and $T_{high}$, respectively. In particular, $T_{low}$ and $T_{high}$ can be adjusted to be below and above the Curie temperature $T_c$, respectively. With such an arrangement it is possible to generate secondary magnetic fields with disparate local patterns. In the example shown, it is indicated schematically how the secondary magnetic field in the neighborhood of the portion at $z_a$ has a component $B_z(z_a)$ directed in positive z-direction, whereas in the neighborhood of the portion at $z_a$ the secondary magnetic field has a component $B_z(z_b)$ directed in negative z-direction.

An exemplary arrangement of an MRI apparatus including a plurality of adjustable magnetic field elements acting as secondary magnetic field sources for providing an adjustable magnetic field B' is shown in FIG. 3. The arrangement comprises a radiofrequency (RF) coil 1 and a cylindrically formed element 2 made of a first magnetic material M1 and provided with a plurality of distinct shimming portions 3 of a second magnetic material M2. The element 2 is arranged surrounding a schematically shown sample or object zone 4. As generally known for such arrangements, the RF coil 1 is provided with a plurality of capacitor elements 5.

Example 1

Magnetic Pebbles—Materials with Controllable Magnetism for Compact, Low-Power Shim Units Introduction Susceptibility induced off-resonances challenge many cutting-edge applications using single shot read-outs, balanced acquisitions or high-resolution spectroscopy, in particular at ultra-high fields. $B_0$ shimming with increased number of channels yields critical improvements [8], but significantly reduces free bore diameter. Coil conductors in close proximity to the subject [9] or even on the RF coils [4] reduce space and power requirements. However, unwanted interactions with RF and gradient operation was reported as a main issue and the handling is aggravated by the amount of conductors in the unit and the large number of high-current wires routed through the bore. Furthermore highly stabilized current supplies need to be fitted in the technical room.

As an alternative we present the integration of ferromagnetic materials whose magnetization can be accurately controlled in-situ as opposed to traditional passive shims [1]. Thereby the secondary field produced by this material is used to shim highly localized. The proposed geometric arrangement allows producing fields with both polarities.

Methods

The magnetic moment density (m) of a ferromagnetic particle in a strong external magnetic field can be controlled by its temperature ([10], FIG. 4A). At Curie temperature ($T_C$) the ferromagnetism vanishes and renders the material paramagnetic. By heating its magnetic moment is gradually reduced by more than an order of magnitude, correspondingly the secondary fields nearly vanishes. Hence by controlling the material temperature a shim field can be tailored.

For obtaining a reasonable temperature range, Nickel and Copper were alloyed to shots in a Ni75Cu25 stoichiometry [7] resulting in a $T_C$ of 350° K (FIG. 4B). Each shot of ~(3 mm)³ is restively heated, its temperature is measured by a Pt500 thermistor and it is thermally isolated and shielded (FIGS. 6A and 6B).

To produce fields of both polarities using materials with only positive susceptibilities, the magnetic material is arranged in a matrix such that its net secondary field is uniform when the magnetization of the heated particles is roughly halved (e.g. FIG. 5). In a first example, 35 particles were arranged on the axis of the main magnetic field by press fitting in a wooden bar with 16 mm distance (FIG. 6C). Three controllable magnetic particles (having 2 m at low temperatures) were mounted in the center-slots, obtaining from each a net field outside the cylinder of approximately a dipole with a magnetic moment of −m to +m.

The secondary field of the shim unit was measured by $B_0$ mapping (Philips 3T Achieva, Best Netherlands) with 3 ms echo-spacing in a phantom bottle placed directly on top of the unit. 3 magnetic field probes (Skope MRT, Zurich, Switzerland) were each placed about 1 cm from each unit and 2 on top of the bottle.

Results

FIGS. 7A and 7B show the net $B_0$ fields induced by the three shim units temporally and spatially. Voltages from 0-10 V were applied in steps resulting in a temperature range from 293-420° K. The surface of the unit did warm up hardly noticeably. The slew rate was about 1 µT/s. FIG. 7B shows field profiles in about 4 cm distance from the units. The ripples in the shim field next to the unit in the sagittal images result from the discretization of the magnetic moment distribution from a continuous cylinder into individual shots. They are expected to be drastically reduced once the NiCu is cast into a cylindrical geometry.

Discussion

Particles with controllable magnetism produce shim-field patterns with high spatial degrees of freedom. Since the source of the field is not an electric current but the magnetism of the material, smaller form factors and lower current consumptions are achieved and the particles are well decoupled from gradient and shim as well as from RF coils. Opposed to passive shims, rearranging the material is not required to fit subject specific susceptibility distributions.

The heat required to control the units can be administered by DC and AC currents as well as optically tunable materials can be employed [11]. Furthermore the power delivery for the heating can be efficiently modulated by switched mode schemes such as by PWM current sources similarly as used for LED lightings where tens of channels can be housed in a single IC package. This allows placing the required electronics in the bore which dramatically reduces the involved cabling efforts.

Very large numbers of independent shim channels can be integrated in RF coils with low additional weight and space requirements. Thereby high degrees of freedom can be obtained therefore the approach is expected to be well suited for shimming of susceptibility induced off-resonances i.e. in the prefrontal cortex, ear channels or the spine.

Example 2

Adaptive Shimming Procedure

Preparations

The dependence and spatial pattern of the fields induced by the individual shim units in the volume of interest in the subject have to be known in advance. There are various methods for obtaining this information. Typically this information will be gathered during the design or installation/maintenance procedure of the device.

The field patterns can be either obtained by magnetostatic field simulations/calculations using the knowledge of the geometrical distribution of the employed materials and its magnetic properties. Alternatively, the fields can be measured using a field camera, a scanning magnetic field probe or an MRI based tomographic procedure (B0 mapping sequence, [12, 13]) performed on a phantom or in-vivo/in-situ. For isolating the fields induced by the shimming units from the field induced by other structures and magnets, the field can be measured with different control parameter values or with and without shimming unit present and the measurements can subsequently be compared.

Similarly, the dependence of the induced shimming field on the control parameter can be directly measured in an MRI scanner using one of the method mentioned above. Thereby it might be sufficient in many cases to acquire a calibration curve for the employed material and using this information together with the spatial distribution of the material to calculate an estimate of the induced fields.

Furthermore, in most cases the spatial distribution of the induced fields is linearly dependent on the magnetic moment of the employed material at the given control variable. Therefore the acquisition/estimate of the field distribution can be separated from the estimation of the magnetic moment of the material. Consequently, only few field maps covering the entire volume are required.

Finally, since the induced correction fields are in most cases very small compared to the background fields, the individual shim units will only interact very weakly. Consequently, the induced total fields of an array of such shim units will be linearly dependent on the induced field of each unit alone. This linear relation significantly simplifies the calibration procedure in that each unit can be measured separately and accounted according to its geometric position relative to the volume of interest. Furthermore, the calculation of the induced total field is greatly simplified too, which makes the subsequently described optimization procedures much simpler.

Procedure

Before starting the intended MR signal acquisition, the B0 field in the volume of interest is measured in-situ. I.e. the subject/sample is positioned in the scanner as suitable for the subsequent scanning procedure. Well known measurement procedures for active shimming can be employed [13-16] by which the field is obtained on full grid or on projections to appropriate basis functions.

If the shimming units are mounted on movable parts such as a local RF coil or the patient support, the position of the shim units or at least the entire array has to be determined. This can be achieved either by optical markers for positioning or referencing to light visors, direct mechanical or optical measurements or by acquiring and evaluating the signal from NMR active fiducial markers or field probes during positioning scans.

Using the knowledge of the field induced by each shim unit in the sample, the control value for each shim unit can be calculated such that the field distribution in the volume of interest will approximate the given target distribution (typically a uniform field) best. For this purpose, well-known optimization techniques can be employed. In most cases it will be beneficial to employ constrained optimization algorithms incorporating the maximum fields that can be induced by each shimming unit.

The calculated control values are then applied to the shim units.

The procedure described above can then be iterated in order to optimize the accuracy of the field correction. In other words, once the calculated control values have been applied to the shim units, one can repeat the in situ measurement of B0 in the volume of interest and if the deviation from the target distribution is larger than a pre-defined threshold, one can calculate and apply a refined set of control values.

Once the B0 field in the volume of interest is deemed acceptable, one can proceed to carry out the intended MRI signal acquisition.

REFERENCES

[1] D. I. Hoult and D. Lee, Shimming a superconducting nuclear-magnetic-resonance imaging magnet with steel. Rev. Sci. Instrum. 56 (1985) 131-136

[2] A. Bungert, C. D. Chambers, M. Phillips, and J. Evans, Reducing image artefacts in concurrent TMS/fMRI by passive shimming. NeuroImage 59 (2012) 2167-2174

[3] C. Juchem, P. Herman, B. G. Sanganahalli, P. B. Brown, S. McIntyre, T. W. Nixon, D. Green, F. Hyder, and R. A. de Graaf, Dynamic Multi-Coil Technique (DYNAMITE) Shimming of the Rat Brain at 11.7 Tesla. NMR in Biomedicine 27(8) (2014) 897-906

[4] J. P. Stockmann, T. Witzel, B. Keil, J. R. Polimeni, A. Mareyam, C. LaPierre, K. Setsompop, and L. L. Wald, A 32-channel combined RF and B0 shim array for 3T brain imaging. Magnetic Resonance in Medicine, 75 (2015) 441-451

[5] E. Sasioglu, L. M. Sandratskii, and P. Bruno, Pressure dependence of the Curie temperature in Ni2MnSn Heusler alloy: A first-principles study. Physical Review B, 71 (2005) 214412-1-214412-7

[6] Munekata H, Photoinduced Magnetism in Semiconductor-Based Structures, J Supercond 14 (2001) 205-210

[7] S. A. Ahern, M. J. C. Martin, and F. R. S. Sucksmith, The spontaneous magnetization of nickel+copper alloys. Proceedings of the Royal Society of London. Series A, 248 (1958) 145-152

[8] Pan J W et al. Role of very high order and degree B0 shimming for spectroscopic imaging of the human brain at 7 tesla., Magnetic Resonance in Medicine 68(4) (2012)

[9] Juchem C et al. Dynamic multi-coil technique (DYNAMITE) shimming for echoplanar imaging of the human brain at 7 Tesla, Neuroimage 105 (2015) 462-472

[10] Kittel C., Introduction to Solid State Physics, 8th Ed. Wiley (2004)

[11] Munekata H, Photoinduced Magnetism in Semiconductor-Based Structures, J Supercond 14 (2001) 205-210

[12] J. Frahm, K.-D. Merboldt, and W. Hänicke, *Direct FLASH MR imaging of magnetic field inhomogeneities by gradient compensation.* Magn Reson Med, 1988. 6(4): p. 474-480 DOI: 10.1002/mrm.1910060412

[13] K. Scheffler, *Fast frequency mapping with balanced SSFP: Theory and application to proton-resonance frequency shift thermometry.* Magn Reson Med, 2004. 51(6): p. 1205-1211 DOI: 10.1002/mrm.20081

[14] R. Gruetter and C. Boesch, *Fast, noniterative shimming of spatially localized signals—Invivo analysis of the magnetic field along axes.* Journal of Magnetic Resonance, 1992. 96(2): p. 323-334 DOI: 10.1016/0022-2364(92)90085-I

[15] J. Tropp, K. A. Derby, C. Hawryszko, S. Sugiura, and H. Yamagata, *Automated shimming of B0 for spectroscopic imaging.* Journal of Magnetic Resonance (1969), 1989. 85(2): p. 244-254 DOI: http://dx.doi.org/10.1016/0022-2364(89)90140-6

[16] P. C. M. Vanzijl, S. Sukumar, M. O. Johnson, P. Webb, and R. E. Hurd, *Optimized Shimming for High-Resolution NMR Using Three-Dimensional Image-Based Field Mapping.* Journal of Magnetic Resonance, Series A, 1994. 111(2): p. 203-207 DOI: http://dx.doi.org/10.1006/jmra.1994.1248

What we claim is:

1. A magnetic resonance (MR) apparatus comprising:
   a) magnet for generating a main magnetic field in a sample region adapted for introduction of a sample or subject from which a MR signal is to be acquired;
   b) wherein the apparatus is configured to superimpose encoding magnetic fields onto the main magnetic field;
   c) RF transmitter configured to generate MR radiofrequency fields;
   d) driver configured to operate said RF transmitter which is configured to generate radiofrequency fields according to a MR sequence for forming images or spectra and wherein superimposed time dependent encoding fields are generated as a result of operating the driver; and
   e) wherein said magnet comprises a primary magnetic field source providing a static magnetic field $B_0$ and at least one secondary magnetic field source providing an adjustable magnetic field $B'$;
   wherein said secondary magnetic field source comprises at least two spatially distinct portions of a first magnetic material and of a second magnetic material, respectively, said first magnetic material having a first magnetic moment density m1 and said second magnetic material having a second magnetic moment density m2, and means for independently adjusting said second magnetic moment density m2 by variation of an external control parameter,
   the apparatus further comprising at least three magnetic field probes configured to allow determination of an instant spatial distribution of the static magnetic field resulting from said static magnetic field $B_0$ and said adjustable magnetic field $B'$.

2. The MR apparatus according to claim 1, wherein said second magnetic moment density m2 is adjustable in a range extending from values that are smaller than the first magnetic moment density m1 to values that are larger than the first magnetic moment density m1.

3. The MR apparatus according to claim 1, wherein said external control parameter is selected from the group consisting of temperature, pressure, shear and light illumination prevailing at the secondary magnetic field source and electric current flowing therethrough.

4. The MR apparatus according to claim 3, wherein said external control parameter is the local temperature of said portion of second magnetic material, and wherein said adjusting means are configured to adjust said local temperature in a control temperature range extending from a lowest control temperature $T_L$ to a highest control temperature $T_H$, and wherein said second magnetic material has a Curie temperature $T_C$ lying within said control temperature range.

5. The MR apparatus according to claim 3, wherein said Curie temperature $T_C$ is in the range from 300K to 450K.

6. The MR apparatus according to claim 1, wherein said secondary magnetic field source is formed as an elongated body having a longitudinal axis, and wherein a plurality of spatially distinct portions of said second magnetic material are arranged at distinct positions along said longitudinal axis.

7. The MR apparatus according to claim 6, comprising a plurality of secondary magnetic field sources arranged circumferentially around the sample region.

8. The MR apparatus according to claim 1, wherein each secondary magnetic field source comprises means for determining an instant value of the external control parameter.

9. The MR apparatus according to claim 1, wherein said second magnetic material is formed of an alloy containing Fe, Ni, Ga, Mn, Gd, Sm, Nd, Dy, Eu or Co.

10. The MR apparatus according to claim 1, wherein the adjustable magnetic field B' of each secondary magnetic field source in an axial direction z of the static magnetic field $B_0$ can be switched between positive and negative values as a function of the external control parameter.

11. A method of operating a MR apparatus including a sample region adapted for introduction of a sample or subject, the method comprising:
a) providing a static magnetic field $B_0$ via a primary magnetic field source and at least one adjustable magnetic field B' via at least one secondary magnetic field source and generating, via said static magnetic field $B_0$ and said adjustable magnetic field B', a main magnetic field;
b) generating superimposed time dependent encoding fields and MR radiofrequency fields according to an MR sequence for forming images or spectra; and
c) acquiring an MR signal from said sample or subject; wherein said secondary magnetic field source in a) comprises at least two spatially distinct portions of a first magnetic material and of a second magnetic material, respectively, said first magnetic material having a first magnetic moment density m1 and said second magnetic material having a second magnetic moment density m2, wherein said second magnetic moment density m2 is independently adjustable by variation of an external control parameter, and
determining an instant spatial distribution of the static magnetic field resulting from said $B_0$ and said B' via a plurality of at least three magnetic field probes wherein, after said sample or subject has been introduced into the sample region,
said external control parameter is adjusted to obtain a predetermined main magnetic field B resulting from the superposition of the static magnetic field $B_0$ and the adjustable magnetic field B' of each secondary magnetic field source, wherein the adjustment is carried out at a beginning of a MR sequence for forming images or spectra.

12. The method according to claim 11, wherein said second magnetic moment density m2 is adjusted via the external control parameter between values of m2<m1 and values of m2>m1.

13. The MR apparatus according to claim 3, wherein said secondary magnetic field source is formed as an elongated body having a longitudinal axis, and wherein a plurality of spatially distinct portions of said second magnetic material are arranged at distinct positions along said longitudinal axis.

14. The MR apparatus according to claim 13, wherein said external control parameter is the local temperature of said portion of second magnetic material, and wherein said adjusting means are configured to adjust said local temperature in a control temperature range extending from a lowest control temperature $T_L$ to a highest control temperature $T_H$, and wherein said second magnetic material has a Curie temperature $T_C$ lying within said control temperature range.

15. The MR apparatus according to claim 13, wherein said Curie temperature $T_C$ is in the range from 300K to 450K.

16. The MR apparatus according to claim 13, comprising a plurality of secondary magnetic field sources arranged circumferentially around the sample region.

17. A magnetic resonance (MR) apparatus with a sample region adapted for introduction of a sample or subject from which a MR signal is to be acquired comprising:
a) a primary magnetic field source providing a static magnetic field $B_0$ and
at least one secondary magnetic field source providing an adjustable magnetic field B' configured to generate a main magnetic field in the sample region, wherein said secondary magnetic field source comprises at least two spatially distinct portions of a first magnetic material and of a second magnetic material, respectively, said first magnetic material having a first magnetic moment density m1 and said second magnetic material having a second magnetic moment density m2, wherein said second magnetic moment density m2 is configured to be independently adjustable by variation of an external control parameter;
b) wherein the apparatus is configured to superimpose encoding magnetic fields onto the main magnetic field,
c) RF transmitter configured to generate MR RF fields, wherein the RF coil and the RF transmitter are operationally connected to:
a driver configured to operate the RF coil and the RF transmitter and which are configured to generate superimposed time dependent encoding fields and RF fields according to an MR sequence configured to form images or spectra; and
at least three magnetic field probes configured to determine an instant spatial distribution of the static magnetic field resulting from said static magnetic field $B_0$ and said adjustable magnetic field B'.

18. The MR apparatus according to claim 17, wherein said secondary magnetic field source is formed as an elongated body having a longitudinal axis, and wherein a plurality of spatially distinct portions of said second magnetic material are arranged at distinct positions along said longitudinal axis.

19. The MR apparatus according to claim 18, comprising a plurality of secondary magnetic field sources arranged circumferentially around the sample region.

20. The MR apparatus according to claim 17, wherein said second magnetic material is formed of an alloy containing Fe, Ni, Ga, Mn, Gd, Sm, Nd, Dy, Eu or Co.

21. The method according to claim 11, wherein the adjustable magnetic field B' of each secondary magnetic field source in an axial direction z of the static magnetic field $B_0$ can be switched between positive and negative values as a function of the external control parameter.

* * * * *